United States Patent

Prill

[15] 3,678,501

[45] July 18, 1972

[54] CIRCUIT FOR CONVERTING AN UNKNOWN ANALOG VALUE INTO A DIGITAL VALVE BY SUCCESSIVE APPROXIMATIONS

[72] Inventor: Robert S. Prill, West Paterson, N.J.

[73] Assignee: The Singer Company, New York, N.Y.

[22] Filed: Nov. 3, 1969

[21] Appl. No.: 873,196

[52] U.S. Cl. ....................340/347 AD

[51] Int. Cl. ....................H03k 13/17

[58] Field of Search ....................340/347; 235/154; 324/99 D; 307/228, 237; 328/106

[56] References Cited

UNITED STATES PATENTS

| | | | |
|---|---|---|---|
| 2,954,502 | 9/1960 | Carpenter et al. | 307/228 X |
| 3,058,013 | 10/1962 | Acker | 307/237 X |
| 3,255,449 | 6/1966 | Euler | 340/347 AD |
| 3,469,254 | 9/1969 | Goosey et al | 340/347 AD |
| 3,504,189 | 3/1970 | McHenry | 328/106 X |

*Primary Examiner*—Maynard R. Wilbur
*Assistant Examiner*—Leo H. Boudreau
*Attorney*—S. A. Giarratana and S. Michael Bender

[57] ABSTRACT

An analog-programmed, successive-approximations, analog to digital/digital to analog (A to D, D to A) converter circuit wherein an unknown analog voltage input signal is converted to a digital output signal. The converter includes an analog programmer comprising a plurality of binary-weighted, series-connected resistors in circuit with a known reference signal to provide weighted, known input signals to each of a plurality of differential comparators. A sweep signal, in circuit with the unknown analog signal, provides a second input to the differential comparators of the analog programmer. The programmer comparators are sequentially switched at known signal magnitudes from one logical state to another to provide a plurality of discrete signals. The changes in the respective output states of the comparators provide a first data input to corresponding flipflop circuits in a data register. A predetermined digital output state of the data register will enable a corresponding analog summing path of a precision D to A converter. Each analog summing path comprises a diode in circuit with a binary-weighted resistor. A current summing amplifier provides a signal to the input of a data feedback comparator which indicates the relative magnitudes of the known input signal and the unknown test signal. When the magnitude of the unnown input signal exceeds the magnitude of a test signal in the circuit, the data feedback comparator produces an output having a predetermined logical state. That predetermined output from the data feedback comparator will cause a predetermined flipflop circuit in the output data register to enable the corresponding analog summing path in the converter circuit means. Conversely, when the magnitude of the input signal is less than the magnitude of the test signal, the corresponding converter analog summing path will remain in its disenabled state. By sequentially switching the programmer comparators at predetermined intervals, the unknown input signal is determined by successively approximating the magnitude of the input signal by successively enabling the signal summing paths in the converter section.

17 Claims, 5 Drawing Figures

Patented July 18, 1972

3,678,501

3 Sheets-Sheet 1

INVENTOR

ROBERT S. PRILL

BY S. A. Giarratana

ATTORNEYS

Patented July 18, 1972

3,678,501

3 Sheets-Sheet 2

INVENTOR

ROBERT S. PRILL

BY

ATTORNEYS

INVENTOR

ROBERT S. PRILL

BY S. A. Giarratana

ATTORNEYS

CIRCUIT FOR CONVERTING AN UNKNOWN ANALOG VALUE INTO A DIGITAL VALVE BY SUCCESSIVE APPROXIMATIONS

BACKGROUND OF THE INVENTION

This invention relates to a high speed analog to digital converter. More particularly, this invention relates to an expandable, analog-programmed, successive approximations analog to digital/digital to analog (A to D/D to A) converter.

A typical prior art A to D converter includes an unknown voltage input in circuit with a precisely known voltage connected to a resistive network. Various points in the resistive circuit represent points of known reference potential. The outputs of comparators connected to the points of known reference potential and to the unknown signal thus represent the magnitude of the unknown signal. For example, if a comparator connected to a known 8-volt tap is actuated, but a comparator connected to a known 9-volt tap is not enabled, the unknown voltage signal thus lies between 8 and 9 volts. Greater accuracy may be obtained by using an additional circuit wherein the difference between the unknown and known signal provides the input to that additional circuit. For example, a second circuit similar in construction to that described above will more precisely indicate the magnitude of the input signal between 8 and 9 volts.

Such a circuit is not entirely satisfactory because of the large number of components which are required and because the speed of the conversion cycle is quite slow. For example, a separate comparator circuit is required for each of the magnitudes of known reference potential which is tested and the output from each of the comparators must be individually determined before the next comparison may be undertaken. Such sequencing causes substantial delays in the completion of the conversion cycle.

A modification of the above circuit uses a plurality of binary-weighted resistors, connected either in series or in parallel, to provide a plurality of signal summing paths for determining the magnitude of the unknown input signal through a method of successive approximations. Switches, for example, transistors, are in circuit with each of the signal summing paths. A known reference signal is applied to one terminal of the switch. The unknown input signal is applied, usually through a weighted resistor, to the other terminal of the switch. Actuation of the switch will thus cause the input signal to be compared to the known reference signal, either directly or through a weighted comparison.

Other known methods for performing an A to D conversion may utilize digitally-programmed, successive-approximations, feed-forward converters; digitally-programmed, straight successive-approximations converters, and digitally-programmed, charge-gated, dual slope, feed-forward, ramp converters.

However, all of these circuits generally require complex digital control circuitry for logically sequencing and programming the converter. Such control circuitry is generally quite complex, requires large amounts of power and large volume and often is capable of only reduced reliability. Moreover, such control circuitry often causes serious noise problems in the analog input signal, resulting in reduced accuracy or loss of input data.

Accordingly, it is an object of the invention to provide a relatively simple and small converter circuit which costs less to produce and requires less power than typical known converter circuits.

It is another object of this invention to provide an expandable, analog-programmed, successive-approximations converter circuit which is capable of being connected in tandem with a like circuit to provide a converter circuit having an 11 bit accuracy and high resolution.

It is a further object of this invention to provide a circuit which avoids the need for digital logic circuitry when sequencing the successive approximations converter.

It is a further object of the present invention to provide a circuit which utilizes an analog programmer for sequencing the A to D converter and which also provides an enter data command to the data register at known binary-weighted, quantized test currents.

It is a further object of this invention to perform an analog to digital/digital to analog conversion on an unknown input signal when using the same circuit elements.

It is still another object of this invention to provide a converter circuit which utilizes a summing amplifier which does not saturate, thus avoiding circuit delay problems related to the recovery time of the amplifier from saturation.

It is a further object of this invention to provide a converter circuit which uses a sweep voltage which avoids amplifier settling time problems by sequentially enabling each of a plurality of comparators in an analog programmer.

These and other objects of the invention will become apparent from a review of the detailed specification which follows and consideration of the accompanying drawings.

SUMMARY OF THE INVENTION

In order to achieve the objects of the invention and to overcome the problems of the prior art, the A to D/D to A converter circuit according to the invention includes a source of unknown analog signals and a source of known reference signals in circuit with an analog programmer. A second input to the analog programmer includes a source of monotonic sweep test signals for sequentially enabling each of a plurality of comparator circuits connected to the source of unknown signals and to the sweep signals as well as to one of a plurality of known reference signals obtained from a binary-weighted resistive network in circuit with the source of reference signals.

Data register means include a plurality of flipflop circuits. The outputs from each of the comparator circuits in the analog programmer comprise the respective first inputs to the flipflop circuits in the data register.

Precision A to D/D to A converter means comprise a plurality of analog summing paths which include a diode connected in series with a binary-weighted resistor. A summing amplifier is in circuit with the input signal and the converter means and indicates whether the input signal exceeds the sum of a test signal and previously summed signals.

The output from the summing amplifier provides the input to a data feedback comparator. The output from the data feedback comparator provides a second input to each of the flipflop circuits of the data register and is capable of enabling a corresponding summing path of the converter means. When the current corresponding to the unknown voltage signal exceeds the test current, a predetermined flip-flop in the data register provides an output responsive to both the output from the corresponding comparator in the analog programmer and to the output of the data feedback comparator which enables the corresponding current path in the A to D converter.

DETAILED DISCUSSION OF THE DRAWINGS

Figure 1:
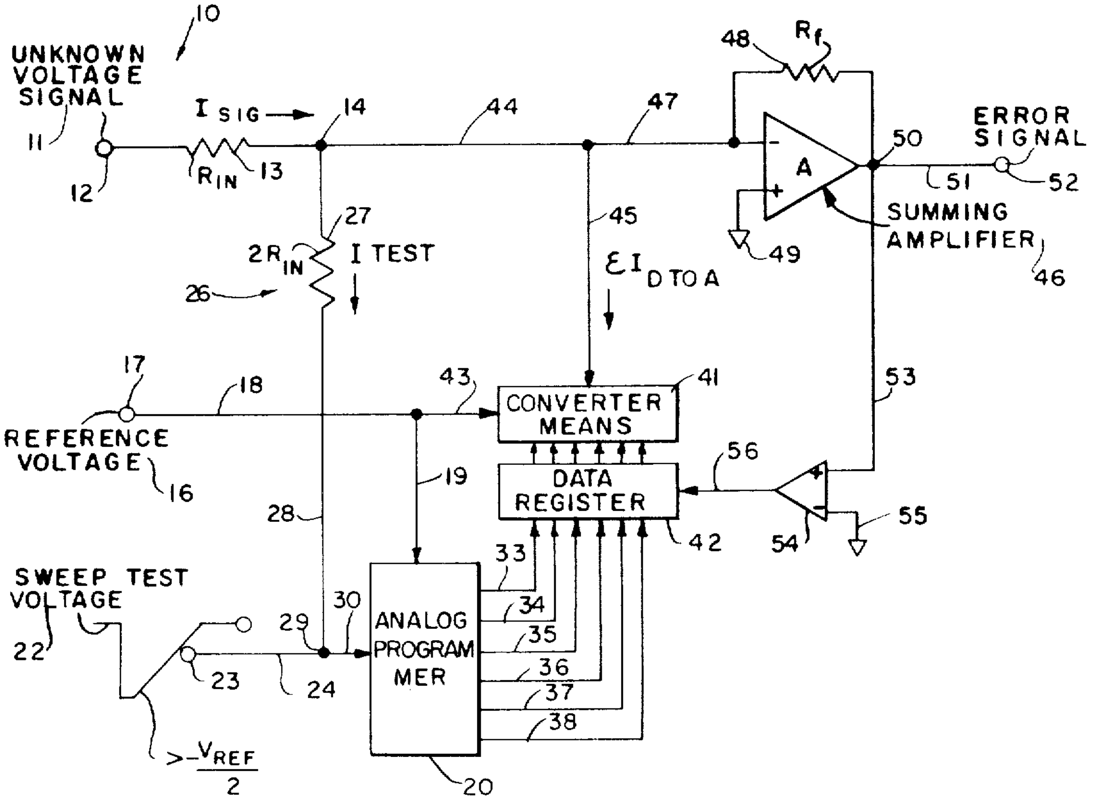
FIG. 1 is a block diagram of the circuit according to the invention showing the respective inputs and circuit components.

As shown in FIG. 1, a first input circuit 10 of the converter includes a source 11 of unknown analog voltage signals, input terminal 12, and input resistor 13 having a value of $R_{in}$ connected between the input terminal 12 and a first signal summing node 14. The source 11 of unknown signals provides unipolar, positive, direct current analog signals, having an anticipated range, for example, from 0 to +5 volts.

A second input to the converter circuit includes a source 16 of reference voltage in circuit with second input terminal 17 and connected to lead 18 and lead 19 to provide an input to analog programming means 20 and converter means 41. The source 16 of reference voltage provides negative, uni-polar, direct current, precisely known reference voltage signals. Preferably, the polarity of the reference signals is opposite to the polarity of the unknown signal, which is disclosed as an example of the invention. In the specific embodiment, reference source 16 is a −10-volt compensated direct current source.

A source of variable test voltage is shown generally at 22, and has a peak magnitude greater than one half the reference voltage or, in other words, greater than 5 volts in the specific embodiment. The sweep test voltage 22 is connected to third input terminal 23 and lead 24 to analog programming means 20.

Signal test means, shown generally at 26, are provided for subtracting known test currents at a plurality of discrete instants from the unknown input signal current at node 14. Test means 26 comprise a resistor 27 having an illustrative value of $2R_{in}$, connected to node 14 and to lead 28 which is connected to node 29 in circuit with leads 24 and 30.

A plurality of outputs 33 through 38 from programmer 20 correspond to the number of discrete comparisons between the reference voltage on line 19 and the signal on lead 30, which comparisons occur in analog programming means 20. Leads 33 through 38 provide the respective inputs to the data register means 42.

Converter means 41 comprise a plurality of analog summing paths which are capable of being sequentially enabled. The reference voltage provided by source 16 is applied to the converter means 41 by way of lead 43 while the signal resulting after the subtraction of the test signal from the input signal is available to converter means 41 by way of leads 44 and 45.

In operation the system stores a binary number in data register 42 so that binary output signals of the data register represent the magnitude of the unknown analog input signal 11. The converter means 41 converts the stored binary number to analog currents, the sum of which is conceptually represented in the block diagram of FIG. 1 by the current flowing in lead 45. The sum of these currents is subtracted from the current in lead 44 remaining after subtraction of the test current from the unknown signal current.

The current input to summing amplifier 46 is thus the current remaining after the respective signal subtractions and is equal in magnitude to the input signal current less the test current, less the sum of the current which has undergone the digital to analog conversion in lead 45. The remaining current thus provides the input to summing amplifier 46 on input lead 47. Analog current subtraction is achieved because the input lead 47 to the amplifier 46 is held substantially at ground potential. Accordingly, the unknown input signal current will equal the unknown signal voltage divided by $R_{in}$ and the test current subtracted from the unknown signal current will be equal to the sweep voltage divided by $2R_{in}$.

The summing amplifier is shown diagrammatically and includes feedback resistance 48. One of the input terminals of amplifier 46 is connected to a source of bias control 49 which provides the fourth input to the converter circuit of the invention. The output from amplifier 46 at node 50 provides the error signal output on lead 51 to error signal output terminal 52.

The voltage output at node 50 from summing amplifier 46 provides the input by way of lead 53 to one of the input terminals of the data feedback comparator 54. The second input terminal of data feedback comparator 54 is connected to a source of reference potential, such as ground, by way of lead 55. The output from comparator 54 on lead 56 provides an input to data register 42.

In operation, the respective outputs 33–38 from analog programming means 20 sequentially enable corresponding analog signal summing paths in converter means 41 and also provide data indicative of the respective output states of the programmer 20 to corresponding circuits in the data register 42. The analog program output states are sequentially switched from a logical "one" or high state to a logical "zero" or low state starting with the output state on lead 33 and proceeding in sequence to lead 38.

When the output from the programmer 20 changes state, for example, from a logical "1" to a logical "0," data is provided to a corresponding portion of data register 42 to control the corresponding analog summing path of the converter circuit 41. The sequential switching of the outputs 33 through 38 of the programmer 20 at predetermined intervals is caused by sweeping the test voltage 22 from a voltage potential more negative than one half the reference voltage of source 16 toward 0 volts through a plurality of binary-weighted test voltages. These test voltages are derived from the known voltage source 16 in circuit with a voltage divider including a plurality of binary-weighted resistors. The output from each of several taps on the resistive divider provides the input to one of a plurality of differential comparators in the analog programmer 20.

Figure 5:
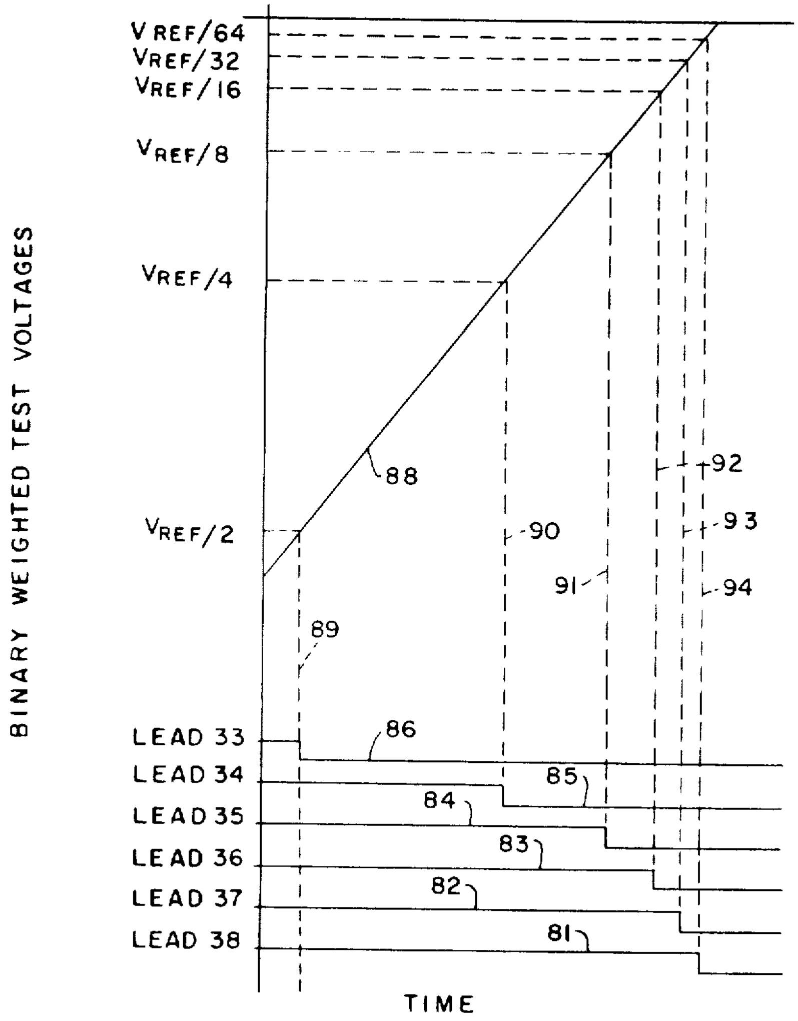

FIG. 5 illustrates that, as the test voltage 22 passes through each binary-weighted level, the output from the analog programmer 20 changes in state in succession with lead 33 first and lead 38 last from an initial high, logical "1" state to a low, logical "0" state. The test voltage is represented by curve 88 and the output voltages of the programmer on leads 33 through 38 are represented by curves 81 through 86. The binary-weighted levels are indicated as $V_{ref}/2$, $V_{ref}/4$, $V_{ref}/8$, $V_{ref}/16$, $V_{ref}/32$ and $V_{ref}/64$. The changes in the output states of the programmer successively lock the data into the data register 42 determined by the output state of the data feedback comparator 54. The outputs from the data register 42 both (1) command the enabling of the corresponding analog summing path of the converter circuit 41 and (2) provide the storage of digital data in the data register 42. Since the output voltages from the programmer 20 control corresponding circuits in the data register 42 and converter means 41 in a precisely timed sequence, these output voltages are referred to as "clock signals".

The data register 42 operates as follows: Information present at the input lead 56 to the data register 42 is stored in register 42 and is transferred to the output of the data register 42 connected to the converter circuit 41 when the signal on the corresponding input leads 33 through 38 switches to a low level.

When the signal voltage on one of leads 33–38 changes to a low state, at which time the sweep voltage 22 passes through a binary-weighted test voltage as indicated in FIG. 5, the logical "1" or "0" information that was present at that instant that the input to the data register 42 from the output of the data feedback comparator 54 is stored in the data register 42 and is applied to the input to the converter circuit 41. That data is retained for the remainder of the conversion cycle and until the programmer is reset at the beginning of a new conversion cycle, at which time the sweep test voltage 22 is at its initial condition and the outputs of the programmer are again all high. An important feature of the invention resides in the fact that the only instances of time that the current summation on lead 45 and the analog signal current on lead 47 are significant is when the sweep test voltage 22 passes through one of the analog-programmed binary-weighted test voltages shown in FIG. 5. At each of these instances, precisely known amounts of current equal in magnitude to corresponding test current values are subtracted from the unknown input signal current in the analog summing paths of converter means 41. The magnitude of the test current subtracted each time an output from the programmer switches from a logical "1" to a logical "0" state is precisely one-half of the current subtracted during the previous sampling.

As an example of the operation of the circuit according to FIG. 1, suppose that the signal current minus the currents subtracted by converter means 41 is greater than the test current at the time the test voltage crosses one of the analog-programmer binary-weighted test voltages, such as at lead 35. In such a case the resulting signal current flowing to amplifier 46 in lead 47, which will equal the unknown input signal current minus the currents subtracted by the converter means 41 and minus the test current, will be greater than zero. A signal current in lead 47 flowing to amplifier 46 greater than zero provides a voltage output from the summing amplifier 46 which causes the output from the data feedback comparator 54 to be logical "0." When an output of the programmer 20 switches from logical "1" to logical "0," the logical output state of the comparator 54 is locked into a corresponding stage of the data register. Since in the example the input to the data register 42 from the data feedback comparator 54 is zero when the output of the programmer on lead 35 switches from "1" to "0," the "0" is locked into the corresponding stage of the data register. This condition enables the corresponding current summing path of the converter network 41 to subtract from the summing junction a current equal in magnitude to that of the test current when the output of the programmer on lead 35 switched from "1" to "0."

If the magnitude of the signal current minus the currents subtracted by the converter 41 is less than the magnitude of the test current, a logical "1" will appear at the output of the comparator 54. When the sweep test voltage passes through one of the binary-weighted test voltages, a corresponding output of the programmer will switch to "0" as discussed above and the logical "1" at the output of the comparator 54 will be locked in and retained in the corresponding stages of the data register 42 for the remainder of the conversion cycle. Because a "1" is stored, the corresponding current summing path of the converter circuit 41 will not subtract current from the signal current.

The above described process is repeated each time the sweep test voltage is equal in magnitude to one of the analog programmed, binary-weighted test voltages. At each of these times, it is determined whether the signal current is greater or less than a sum of the test current and the currents subtracted by the converter circuit 41 as a result of binary data already locked in the data register. In this manner, by successive approximations, the current subtracted by the converter 41 is made to approach that of the unknown input signal current and the binary number stored in the data register 42 is made to correspond with the input signal. Since in the logic system described, a "0" is stored in the data register 42 when the signal current is greater than the sum of the test current and the currents subtracted by the converter means 41, the binary number stored in the data register will be the complement of the binary number directly representing the input signal voltage. From this complement, a binary number representing the input signal is readily derived as is described with reference to FIG. 2.

Figure 2:
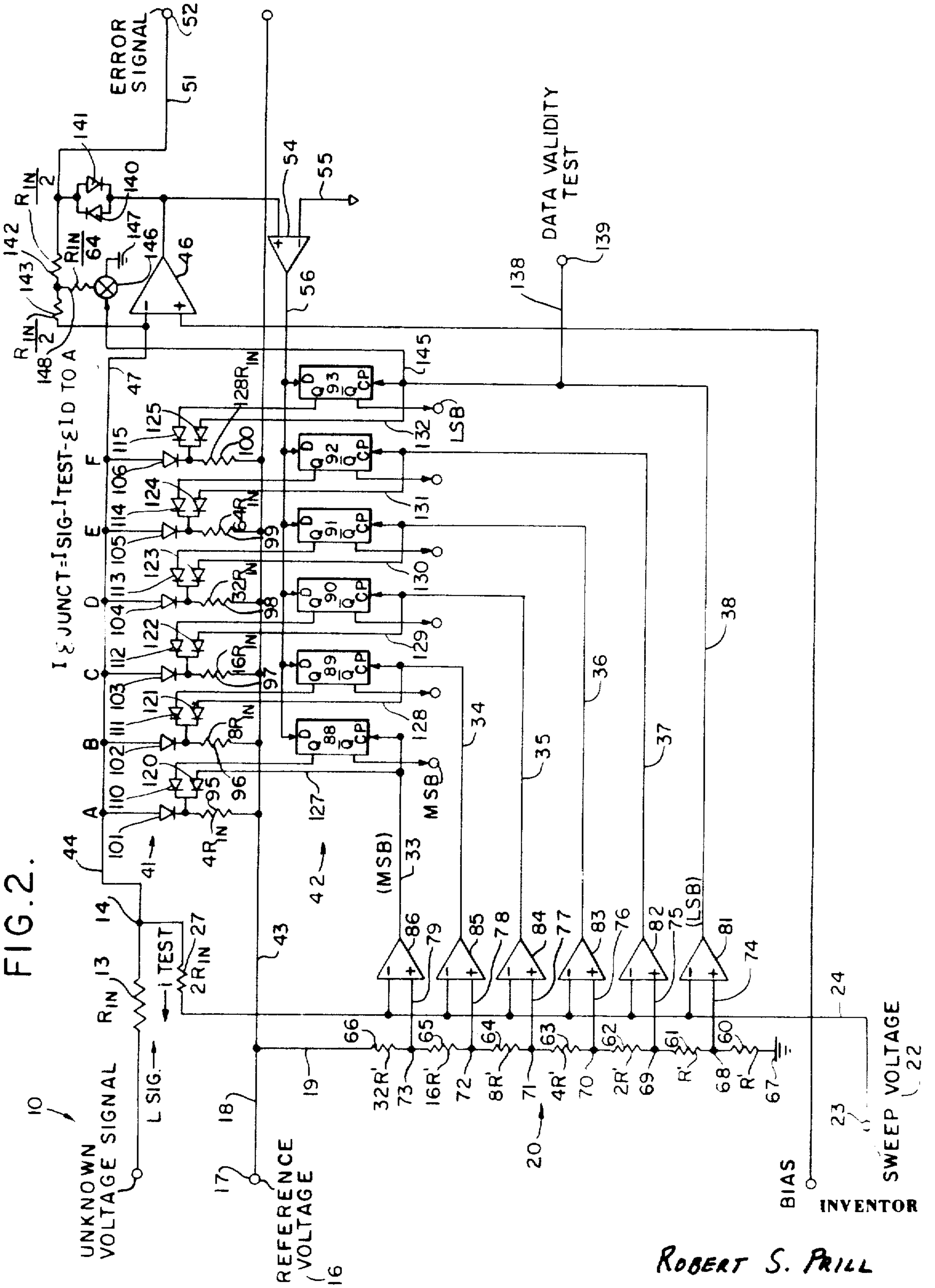
FIG. 2 is a circuit diagram of the invention in greater detail.

In FIG. 2, elements which are also illustrated in FIG. 1 are identified with like reference numerals.

As shown in FIG. 2, analog programming means 20 includes a plurality of binary-weighted resistors 60–66 having values R', R', 2R', 4R', 8R', 16R', and 32R', respectively. Resistors 60–66 are connected in series to known reference voltage source 16 by way of leads 18 and 19. Resistor 60 is connected to a second source of reference potential, preferably ground 67, thus providing a precisely known voltage drop across the divider circuit. Voltage taps 68 through 73 are provided between adjacent resistors in the divider. The leads 74 through 79 provide the inputs to the positive terminals of analog high speed differential comparators 81–86, respectively. Since the source of reference voltage is −10 volts, the known exact reference voltage is −5 volts at node 73, −2.5 volts at node 72, −1.25 volts at node 71, −0.625 volts at node 70, −0.3125 volts at node 69 and −0.15625 volts at node 68. Thus, the input voltage to one of the input terminals of each of the comparator circuits is accurately known.

The switching of comparators 81 through 86 occurs at the precise instant that the sweep voltage 22 applied to the negative input terminal of a comparator is precisely equal in magnitude to the known voltage applied to the positive terminal of the comparator by leads 74 through 79, respectively. For example, comparator 85 will switch from its logical "1" or high state to its logical "0" or low state when the sweep voltage passes through −2.5 volts, since the known voltage at node 72 is −2.5 volts.

In FIG. 5, the sweep of the monotonically varying voltage applied at terminal 23 indicated by curve 88 is shown, for example, as linear. The respective comparators switch states from high to low when the sweep voltage reaches a magnitude designated by the dotted lines 89–94. The sweep voltage curve 88 may be other than linear. If the curve of sweep voltage is exponential, for example, the time intervals between successive switching of comparators 81–86 become more nearly alike.

The curves representing outputs from the comparators in FIG. 5 are designated with the same reference numeral assigned to the comparator in FIG. 2, i.e., numerals 81 through 86. Thus, comparator 86 switches from its high state to its low state at −5 volts as shown at dotted line 89; comparator 85 switches at −2.5 volts as shown at dotted line 90, and each of the succeeding comparators 84–81 switch at one half the voltage at which the immediately preceding comparator switches as shown at dotted lines 91–94, respectively.

Simultaneously, as shown in FIG. 2, the unknown voltage signal 11 provides a signal current from which a test current is subtracted at node 14. Thus, when the sweep voltage is at a magnitude of −5 volts, comparator 86 is caused to switch from its high state to its low state to determine the most significant bit in the binary output. At the time of switching, the test current drawn by the test circuit 26 is one half of the maximum input signal current, because of the relationship in magnitude of resistors 27 and 13, i.e. $2R_{in}$ to $R_{in}$. As pointed out above in order to get analog current subtraction, the potential at the negative input to amplifier 46 and, accordingly on lead 44, is at virtual ground potential.

Data register 42 preferably is a monolithic circuit comprising a plurality of flipflops 88 through 93 each having complementary $q$ and $\overline{q}$ outputs. The clock signals on leads 33 through 38 are applied to the cp inputs of the flipflops 88 through 93 respectively to control the flipflop 88 to store the most significant bit in the output binary number, and to control each of the succeeding flipflops 89 through 93 to store the next most significant bit after that stored by the preceding flipflops, whereby the flipflop 93 stores the least significant bit in the data register 42.

Each of the flipflops 88 through 93 includes a second input ($d$) connected via lead 56 to the output of feedback comparator 54. When the cp input is at a logical "0" state, the flipflop is set in the same state as the signal applied to the ($d$) input. When the clock signal applied to the cp input switches to logical "0," the state of the flipflop can no longer follow the state of the signal applied to the ($d$) input. Accordingly, the logical state of the signal applied to the ($d$) input of a flipflop at the time the clock signal applied the cp input of the flipflop switches from logical "1" to logical "0" is locked in the flipflop for the remainder of the conversion cycle. The $q$ output of each flipflop will be logical "1" when the flipflop is in its logical "1" state and will be logical "0" when the flipflop is in its logical "0" state. The $\overline{q}$ output, which is complementary to the $q$ output of each flipflop circuit, will be logical "0" whenever the flipflop is in its logical "1" and will be logical "1" whenever the flipflop is in its logical "0" state. Since the data register 42 stores the binary complement of the binary number which represents the unknown input signal, the $\overline{q}$ outputs from flipflops 88 through 93 at the end of a conversion cycle will represent the magnitude of the unknown voltage signal.

Converter means 41 comprises a plurality of current summing paths A-F each scaled by the relative weight of the binary-weighted resistors to equal precisely the current in test means 26 each time the corresponding conversion is made.

Current paths A through F are comprised of resistors 95 through 100 respectively connected in series with diodes 101 through 106 respectively. The resistors 95 through 100 have resistance values $4R_{in}$, $8R_{in}$, $16R_{in}$, $32R_{in}$, $64R_{in}$ and $128R_{in}$, respectively. One terminal of each of the resistors 95–100 is connected to the source of reference voltage 16 via lead 43. Each of the diodes 101–106 has its anode connected to the virtual ground potential on lead 44 to provide an analog summing path between the reference potential and ground potential.

Current path A, if enabled, will draw the same current as appears in the test circuit when the sweep voltage is at a level which actuates comparator 86, while current path B, if enabled, will draw the same current as is in the test circuit when comparator 85 is actuated and current paths C through F, if enabled, will draw the same currents as in the test circuit at the precise time that comparators 84 through 81, respectively, are actuated by sweep voltage 22. The cathodes of the diodes 101 through 106 are connected to the cathodes of diodes 110 through 115, respectively, and to the cathodes of diodes 120 through 125, respectively.

The anodes of the diodes 110 through 115 are connected to the q outputs of the flipflops 88 through 93, respectively, and the cathodes of the diodes 120 through 125 are connected via leads 127 through 132 to the output leads 33 through 38, respectively, of the programmer 20. Each of the current paths A through F will be enabled when the corresponding pair of diodes in the sets 110 through 115 and 120 through 125 connected thereto are both rendered non-conductive. When either of the corresponding pair of diodes is conductive, the current path will be disabled and will not conduct because one of the diodes 101 through 106 in the current path will be back biased. For example, the current path A will be enabled and will conduct when both of the diodes 110 and 120 are non-conductive and will be disabled when either of the diodes 110 or 120 is conductive. The diodes 110 through 115 are each rendered conductive whenever the corresponding one of the flipflops 88 through 93 is in its logical "1" state so that the q output of the flip flop is logical "1" and is rendered non-conductive when the corresponding flipflop is in its logical "0" state. Similarly, the diodes 120 through 125 are each rendered conductive when their cathodes are connected to logical "1" and rendered non-conductive when their cathodes are connected to logical "0." Thus, each of the current paths A through F will be enabled in sequence as the clock signals on leads 33 through 38 change from logical "1" to logical "0" only if logical "0" is locked in the corresponding one of flipflops 88 through 93. Thus, current path A will be enabled when the clock signal on lead 33 switches to logical "0" if logical "0" is locked into flipflop 88 at this time.

If the unknown voltage is the maximum value of 5.0 volts, for example, the total input signal current, which is determined by the ratio of the input voltage to the input resistance $R_{in}$, will be equal in magnitude to $5.0/R_{in}$ amperes. At the time the comparator 86 changes states, the test current is given by the ratio of the sweep voltage to the test resistance $2R_{in}$ and is equal in magnitude to $5.0/2R_{in}$, or $2.5/R_{in}$. Thus, the magnitude of the test current is exactly one half of the maximum magnitude of the input current.

Since the input current exceeds the test current in magnitude, the output from comparator 56 will be at its logical "0" state at the time that the output from comparator 86 switches to its logical "0" state. Since the (*d*) input to flipflop 88 is at a logical "0" state when the cp input switches to logical "0," the flipflop 88 will be locked in its logical "0" state. A logical "0" state from the q output of flipflop 88, as pointed out above, renders diode 110 non-conductive. When the clock signal on lead 33 switches to logical "0" the diode 120 will also be rendered non-conductive.

When diode 120 ceases conducting, the back-bias potential on the cathode of diode 101 is removed and current path A is enabled.

The voltage drop across diodes 101–106 is negligible, so the current flowing in any enabled analog summing path is given by the ratio of the reference voltage $V_{ref}$ to the resistance in that path. Thus, the current in path A is equal in magnitude to $10.0/4R_{in}$ or $2.5/R_{in}$. That current is precisely equal to the current in the test path at the time the clock signal on lead 33 switches to logical "0."

Thus, after logical "0" has been locked in flipflop 88, current path A will subtract $2.5/R_{in}$. When the sweep voltage gets to 2.5 volts, the clock signal on lead 34 will switch to logical "0." At this time the test current will be $2.5/2R_{in}$ or $1.25/R_{in}$. Since current path A will be enabled as a result of logical "0" stored in flipflop 88, the total current subtracted from the input current will be $2.5/R_{in} + 1.25/R_{in}$ or $3.75/R_{in}$, which is less than the input current $5/R_{in}$ in the maximum input signal example. Accordingly, the output of the comparator 54 will be logical "0" and logical "0" will be locked in flipflop 89. Therefore, current path B will be enabled and will begin subtracting a current of $10/8R_{in}$ or $1.25/R_{in}$, which is the value of the test current at the time the clock signal on lead 34 switches to logical "0." In a similar manner, logical "0" will be locked in each of the remaining flipflops 90 through 93 in succession and each of the current paths C through F will be enabled in sequence to subtract a correspondingly weighted analog current in the maximum input signal example. Accordingly, at the end of the conversion cycle all of the flipflops will store logical "0" and the $\overline{q}$ outputs of the flipflops will all be logical "1" representing the maximum binary number.

As a second example of the operation of the circuit during a conversion cycle, let an unknown voltage be slightly greater than 3.125 volts. That voltage will produce a signal current slightly greater than $3.125/R_{in}$. As the sweep voltage 22 passes through −5 volts, comparator 86 switches its output state from high to low as previously described. At the instant of switching, the test current will be $5.0/2R_{in}$ or $2.5/R_{in}$, which is less than the input current. Since the input current is greater than the test current at node 14 under the test condition at which the sweep voltage passes through 5.0 volts to activate comparator 86, logical "0" will be stored in flipflop 88 and current path A will be enabled, as previously described, to subtract from the signal current a current equal in magnitude to the test current.

After the first conversion has occurred, there remains an unconverted current, for this example, slightly greater than $3.125/R_{in} - 2.5/R_{in}$ or $0.625/R_{in}$. As the sweep voltage 22 reaches 2.5 volts, comparator 85 switches from its logical high state to its logical low state. At that instant, the test current is equal in magnitude to $2.5/2R_{in}$ or $1.25/R_{in}$, which is greater than the remaining unconverted current for this example. Thus, the polarity of the current flowing in lead 47 is reversed and therefore, the output of comparator 54 will be at logical "1." Accordingly, a logical "1" will be locked in flipflop 89. Therefore, the output from flipflop 89 will be high and cause diode 111 to conduct to back bias diode 102. Accordingly, diode 102 remains non-conductive, and current path B is not enabled.

In the meantime, the sweep voltage continues its sweep until it passes though 1.25 volts which causes comparator 84 to switch its output from high to low. The unconverted input current for this example remains slightly greater than $0.625/R_{in}$. The test current at 1.25 volts is equal in magnitude to $1.25/2R_{in}$ or $0.625/R_{in}$, or slightly less than the unconverted current. Thus, logical "0" is locked in flipflop 90 and current path C is enabled in the manner previously described with respect to current path A.

As sweep voltage 22 continues, comparator 83 switches its output state at an input of 0.625 volts; however, very little unconverted current from the signal source remains. In a manner like that previously described with respect to current path B, the flipflop 91 has a logical "1" locked therein to provide a logical "1" output at its *q* output back biasing diode 104. Thereafter, the output for comparators 82 and 81 change states at appropriate voltages. However, since there is very little unconverted current, logical "1" is locked in flipflops 92 and 93 and current paths E and F are not enabled, as described with respect to current path B. In this manner, the binary number 010111 is stored in the binary register so that the binary output at the $\bar{q}$ outputs of the flipflop is 101000 to represent the input signal voltage.

Lead 138 and output terminal 139 are connected to the output of the least significant bit comparator 81 to provide an indication of whether the data is incomplete, indicated by a high state, or whether the conversion cycle has been completed, indicated by a low state.

Figure 3:
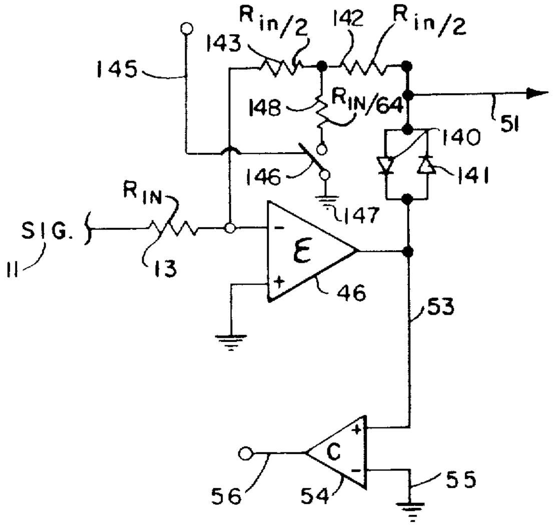
FIG. 3 is a functional block diagram of the summing amplifier and data feedback comparator.

The summing amplifier 46, which is shown in detail in FIG. 3, operates essentially as an operational amplifier in a unity gain mode. Under normal operation, the feedback resistance, assuming that either of diodes 140 and 141 in the feedback path is conductive, is equivalent to the input resistance since the magnitude of the sum of resistors 142 and 143 is equal to the magnitude of the input resistance $R_{in}$.

However, when the output from the comparator 81 changes from a high to a low state on lead 38, this data is transmitted via lead 145 to switch 146 which is closed to a source of reference potential such as ground 147 thus placing resistor 148 in a shunting arrangement with the feedback loop of amplifier 46. When this occurs, the gain of the amplifier is effectively converted to a gain of 32 since a majority of the feedback current will be shunted via the small resistor 148 causing the amplifier to respond with a higher gain. While switch 146 is shown in FIG. 3 as a mechanical switch, it is to be understood that many types of switches, suitable in speed for this arrangement, such as a field effect transistor, may be used.

Diodes 140 and 141 are termed in the art as "hot carrier diodes," and conduct only at a forward bias of about 0.3 volts. When the input to summing amplifier 46 becomes very small, such as to produce an output condition in the range of ±0.3 volts, both of the diodes 140 or 141 will become non-conductive. When this occurs, an effective open circuit occurs in the feedback loop of amplifier 46. Since an open circuit in the feedback loop of this amplifier is effectively the same as an infinite resistance, the gain of the amplifier becomes very high. Thus, while the input to the amplifier remains small, its output tends to increase rapidly to a point where one of the two diodes 140 or 141 again becomes conductive depending on the direction that the amplifier is driven under such operation. In this manner, the output voltage of the summing amplifier is made at least ±0.3 volts for almost any input signal.

Figure 4:
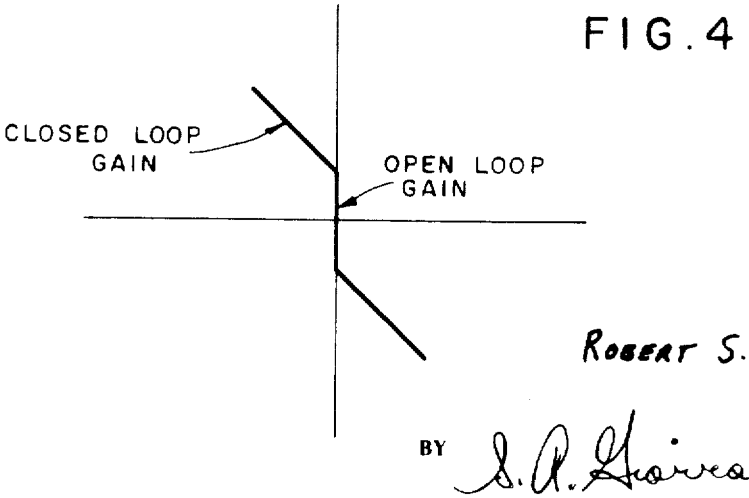
FIG. 4 is a graph of the transfer function of the summing amplifier around the zero null; and, FIG. 5 is a timing diagram relating the binary-weighted test voltages provided to the input of the analog comparators to the state of the data commands from the comparator circuit.

Thus, the amplifier may be seen to operate at a unity gain for most conditions, at a gain of 32 when the least significant bit has been sampled, and at a very high gain when the output voltage is between ±0.3 and −0.3 volts. This is shown by the plot of FIG. 4 showing a very steep slope at the portion of the curve labeled "open loop gain" and a unity gain for the portion of the curve labeled "closed loop gain." The points of transition from open to closed loop gain occur at ±0.3 volts for the diodes contemplated.

The circuit described may be placed in tandem with an additional circuit of the same type to further indicate the magnitude of the unknown voltage. In that instance, the amplifier 46 in the first stage will operate with a gain of 32 and the error signal which appears at terminal 52 becomes the unknown voltage 11 to the second stage, and the A to D/D to A conversion proceeds in a manner previously discussed.

What is claimed is:

1. An analog to digital converter circuit comprising:

a. input means for receiving an unknown input signal, b. a reference signal, c. means for generating a sweep signal, d. means coupled to said input means and said sweep signal means for providing a test signal, e. analog programming means coupled to said reference signal and said sweep signal means for providing a plurality of discrete output signals in sequence in response to predetermined magnitudes of said sweep signal, f. converter means coupled to said input means and having a plurality of analog circuits capable of being selectively enabled and operable to generate analog signals when enabled, g. first circuit means coupled to said input means for providing an output indicative of the difference between the magnitude of said input signal and the sum of said test signal and said analog signals generated by enabled ones of said analog circuits, h. data register means for storing digital data, i. second circuit means coupled to the output of said first circuit means and said analog programming means for storing data in said register in accordance with the output of said first circuit means, and j. third circuit means for enabling selected ones of said analog circuits in said converter means in response to a predetermined relationship between the respective outputs of said programming means and said first circuit means, k. said analog programming means includes a plurality of series-connected, binary-weighted resistors coupled to said reference signal to provide a plurality of known reference signals, and analog comparator means coupled to said known reference signals and said sweep signal means to generate said discrete output signals when the magnitude of said sweep signal passes through the magnitudes of said reference signals.

2. The circuit as defined in claim 1 wherein said analog comparator means includes a plurality of differential comparators, the input to each of said comparators being in circuit with one of said plurality of said known reference signals and the output of said sweep signal means.

3. The circuit as defined in claim 1 wherein said first circuit means includes a current summing amplifier coupled to said input means, said test means, and said converter means.

4. The circuit as defined in claim 3 wherein said first circuit means further includes data feedback comparator means coupled to the output of said current summing amplifier, for providing a logical input to said data register means indicative of the output of said current summing amplifier.

5. The circuit as defined in claim 3 wherein said current summing amplifier includes a feedback circuit, resistive means in said feedback circuit sized so that said summing amplifier operates as a unity gain amplifier under a first output condition.

6. The circuit as defined in claim 5 wherein said current summing amplifier includes gain control means in said feedback circuit to increase the gain of said summing amplifier when the output of said amplifier drops below a predetermined level.

7. The circuit as defined in claim 6 wherein said gain control means includes a pair of diodes in circuit with said feedback path of said amplifier, the anode of one of said diodes being connected to the cathode of the other of said diodes, and the cathode of said one diode being connected to the anode of said other diode.

8. The circuit as defined in claim 5 wherein said current summing amplifier includes means in said feedback circuit to increase the gain of said summing amplifier to operate after the last of said discrete output signals from said analog programming means has been provided.

9. The circuit as defined in claim 1 wherein said data register means comprises a plurality of flipflop circuits each including a first input, a second input, and an output, said first input being in circuit with an output of said first circuit means, said second input being in circuit with an output of said analog programming means and said output of one of said flipflop circuits being in circuit with one of said analog circuits in said converter means.

10. The circuit as defined in claim 1 wherein each of said analog circuits includes a summing diode in series with a resistor, said third circuit means being operable to enable and disable each of said analog circuits by rendering the summing diode thereof conductive and non-conductive respectively.

11. The circuit as defined in claim 10 wherein the resistors in the respective summing paths of said converter means are binary-weighted.

12. An analog to digital converter comprising; a register for storing a digital number;

converter means coupled to said register for generating an analog output that corresponds to the value of the number in said register;

means for generating a sweep signal;

first circuit means for receiving an unknown analog signal, the output of said converter, and said sweep signal for continuously summing said unknown analog signal, said analog output provided by said converter means and said sweep signal for each cycle of said sweep signal;

said first circuit means providing a continuous signal indicative of the difference in magnitude between said unknown analog signal and the sum of said analog output and said sweep signal during each cycle of said sweep signal;

programming means coupled to said sweep signal means for providing a plurality of discrete output signals in sequence in response to predetermined magnitudes of said sweep signal; and second circuit means for receiving said continuous signal provided by said first circuit means and coupled to said register for sequentially entering numeric data that is indicative of the magnitude of said unknown analog signal into said register in response to the occurrence of said discrete output signals.

13. An analog to digital converter according to claim 12 wherein, said second circuit means includes an amplifier to amplify the difference signal produced by said first circuit means, and means coupled to said amplifier for increasing the gain of said amplifier after occurrence of a cycle of said sweep signal when said second circuit means has completed entering a number in said register corresponding to the value of said unknown analog signal.

14. An analog to digital converter according to claim 13 wherein, additional means coupled to said amplifier increase the gain of said amplifier when the output of said amplifier falls below a predetermined value.

15. An analog to digital converter according to claim 12 wherein, said register includes a plurality of stages, said converter includes a plurality of analog circuits corresponding to the number of stages making up said register with each analog circuit capable of being selectively enabled and operable to generate analog signals when enabled.

16. An analog to digital converter according to claim 15 wherein, each said analog circuit is coupled to a corresponding stage of said register and said converter means generates analog signals corresponding to the value of digits stored in stages of said register.

17. An analog to digital converter according to claim 12 wherein, said first circuit means provides an analog current representing said unknown analog signal, said sweep signal comprises a sweep current, said analog signal generated by said converter means comprises analog currents, and said first circuit means comprises means to subtract said analog currents generated by said converter means and said sweep current from the analog current representing said unknown analog signal.

* * * * *